United States Patent [19]
Soeda

[11] Patent Number: 5,329,146
[45] Date of Patent: Jul. 12, 1994

[54] DRAM HAVING TRENCH TYPE CAPACITOR EXTENDING THROUGH FIELD OXIDE

[75] Inventor: Shinya Soeda, Hyogo, Japan

[73] Assignee: Mitsubishi Denki Kabushiki Kaisha, Tokyo, Japan

[21] Appl. No.: 933,632

[22] Filed: Aug. 24, 1992

[30] Foreign Application Priority Data

Dec. 25, 1991 [JP] Japan .................. 3-343117

[51] Int. Cl.⁵ .................. H01L 29/68; H01L 29/06
[52] U.S. Cl. .................. 257/303; 257/301; 257/304
[58] Field of Search .............. 257/301, 303, 304, 305; 365/149; 437/60

[56] References Cited

U.S. PATENT DOCUMENTS

| | | | |
|---|---|---|---|
| 4,721,987 | 1/1988 | Baglee et al. | 257/301 |
| 4,833,094 | 5/1989 | Kenney | 437/60 |
| 4,877,750 | 10/1989 | Okumura | 257/304 |
| 4,905,064 | 2/1990 | Yabu et al. | 257/306 |
| 5,119,155 | 6/1992 | Hieda et al. | 257/304 |
| 5,170,372 | 12/1992 | Wong | 257/304 |

FOREIGN PATENT DOCUMENTS

| | | |
|---|---|---|
| 59-103373 | 6/1984 | Japan . |
| 62-73763 | 4/1987 | Japan . |
| 62-131563 | 6/1987 | Japan . |
| 62-152156 | 7/1987 | Japan . |
| 2-69975 | 3/1990 | Japan . |
| 2-281656 | 11/1990 | Japan . |

*Primary Examiner*—Robert Limanek
*Attorney, Agent, or Firm*—Lowe, Price, LeBlanc & Becker

[57] ABSTRACT

In a memory cell formed of one transistor and one capacitor, the capacitor includes a stacked type capacitor region extending over the gate electrode and word line of the transfer gate transistor, and a trench type capacitor region extending into a groove part formed in the field isolation film for element separation. The trench type capacitor region is formed between a pair of word lines extending on the field isolation film. Each storage node of adjacent capacitors is isolated on the bottom surface of the groove.

4 Claims, 9 Drawing Sheets

DRAM HAVING TRENCH TYPE CAPACITOR EXTENDING THROUGH FIELD OXIDE

BACKGROUND OF THE INVENTION

Field of the Invention

The present invention generally relates to semiconductor memory devices, and more particularly, to a structure of a memory cell of the semiconductor memory device including a stacked type capacitor having increased capacitance, and to a method of manufacturing.

Description of the Background Art

Capacitors are widely employed as passive elements for constituting integrated circuits in conventional semiconductor memory devices. As an example of a semiconductor memory device including such capacitors, a dynamic type RAM (Random Access Memory: hereinafter DRAM) will be described.

FIG. 16 is an equivalent circuit diagram of a DRAM memory cell. Referring to FIG. 16, one memory cell is provided with one MOS (Metal Oxide Semiconductor) transistor and one capacitor. A bit line 16 is connected to one of source/drain regions and a capacitor 3 is connected to the other. A word line 10 is connected to a gate electrode.

In writing data into a memory cell, by applying predetermined potential to the word line 10, a MOS transistor 4 is rendered conductive and electric charge applied from the bit line 16 is stored at the capacitor 3. Conversely, in data reading, by applying predetermined potential to the word line 10, the MOS transistor 4 is rendered conductive, and electric charge stored in the capacitor 3 is withdrawn.

FIG. 15 is a plan structure view of a memory cell of a DRAM having a conventional stacked type capacitor, and FIG. 14 is a sectional structure view taken on line Y—Y in FIG. 15. Referring to FIGS. 14 and 15, a field isolation film 11 is formed on the main surface of a p type silicon substrate 7. The field isolation film 11 is formed for isolating a plurality of semiconductor memory devices formed on the silicon substrate, and the region surrounded by this field isolation film 11 is the element formation region. Element formation region is provided with a transfer gate transistor 4. The transfer gate transistor 4 is provided with a pair of source/drain regions 8, 8 located on both sides of a channel region 18, and a gate electrode 10 formed on the surface of the channel region 18 with a gate oxide film 9 interposed therebetween. The gate electrode 10 is made up of a part of a word line. A lower electrode (storage node) 13 of the capacitor is connected to one of the source/drain regions 8 of the transfer gate transistor 4, and the bit line 16 is connected to the other source/drain region 8. The lower electrode 13 extends on the surface of the gate electrode 10 of the transfer gate transistor 4 and on the surface of a word line 10 passing over the field isolation film 11, with an insulating film 17 interposed therebetween. A dielectric layer 14 is formed on the surface of the lower electrode 13, and an upper electrode (cell plate) 15 is formed on the surface of the dielectric layer 14. The capacitor having lower electrode layer of a stacked configuration on the surface of a silicon substrate is referred to as a stacked type capacitor.

The above described stacked type capacitor has a three dimensionally extending structure with an insulating layer 17 being interposed above the gate electrode 10 and the word line 10 to increase the areas of opposing faces among respective upper and lower electrodes to enhance the capacitance of the capacitor. Accordingly, the capacitance can be further increased by extending the structure higher above the silicon substrate. However, in forming it higher above the substrate, a difficulty is caused to form of a thin film on the surface of the high stepped region. For this reason, in a stacked type capacitor described above, higher integration of the DRAM caused the difficulty of securing the capacitance of the capacitor.

As a result, a DRAM having a memory cell structure which can increase the capacitance of the capacitor has been proposed. FIG. 17 is a sectional structure view of a memory cell of a DRAM disclosed in the Japanese Patent Laying-Open Nos. 62-131563. Memory cells shown in FIG. 17 are provided with a groove part 24 reaching into the silicon substrate 7 in the isolation region between a pair of memory cells adjacent to each other. The field isolation film 11 for isolating the elements is formed on the surface of the groove part 24, and on the surface of the silicon substrate 7 adjacent thereto. One end of the capacitor 3 extends into this groove part 24. That is, the capacitor 3 is formed of the combination of a conventional stacked type capacitor and a trench type capacitor formed inside of the groove 24. The cell plate 15 of the capacitor 3 extends on the surface of a gate electrode or the word line 10 with an insulating layer 26 interposed therebetween, and extends further into the groove part 24. The storage node 13 is formed on the surface of the cell plate 15 with the dielectric layer 14 interposed therebetween, and is isolated, in the groove part 24, from the storage node adjacent thereto. A part of the storage node 13 is connected to one of the source/drain regions 8 of the transfer gate transistor 4 through the opening part formed in the cell plate 15.

A memory cell capacitor shown in FIG. 17 can increase the capacitance of the capacitor by newly adding so-called trench capacitor portion thereto. However, in the capacitor shown in FIG. 17, compared to the stacked type capacitor shown in FIG. 14, the cell plate 15 and the storage node 13 are formed in a vertically reversed direction. For this reason, a part of the cell plate 15 is interposed between the contact part of the gate electrode 10 of the transfer gate transistor 4 and the storage node 13, thus increasing the width of the source/drain region 8 connected to the storage node 13. Increase of the width of the source/drain region 8 easily causes so-called soft error, and becomes a factor preventing the structure of memory cells from being miniaturized. Memory cells shown in FIG. 17 include other factors preventing the miniaturization of the structure. One of them is the fact that the thick field isolation film 11 is formed on the inner surface of the groove 24. For this reason, it is necessary to increase the width of the groove 24 in case to make the capacitor extend into the groove part surrounded by the field isolation film 11. Further, the second factor is that the end of the storage node 13 extending into the groove 24 is stacked with the cell plate 15. Such a structure is a multi-layer stacked structure formed of the storage node 13, the dielectric layer 14 and the cell plate 15 in the groove 24, so the increase of the width of the groove 24 is necessary. That is, a memory cell shown in FIG. 17 can increase the capacitance of the capacitor, whereas the same makes the miniaturization of the element structure difficult, thereby preventing high degree of integration.

SUMMARY OF THE INVENTION

One object of the present invention is to increase the capacitance of a capacitor in a DRAM having a highly integrated memory cell.

Another object of the invention is to provide a method of manufacturing the DRAM provided with a stacked type capacitor having so-called a trench type capacitor portion.

In the first aspect of the present invention, the DRAM includes a semiconductor substrate having a main surface, an isolation insulating layer formed on the main surface of the semiconductor substrate and first and second impurity regions formed on the main surface of the semiconductor substrate and isolated from each other by isolation insulating layer. A groove part having inner lateral surfaces and a bottom surface extending from the surface of the isolation insulating layer into semiconductor substrate is formed in the region of isolation insulating layer. The semiconductor memory device includes a first lower electrode having a first portion extending on the surface of the isolation insulating layer and a second portion extending into the groove part, and a second lower electrode having a third portion connected to the second impurity region and extending on the surface of the isolation insulating layer and a fourth portion extending into the groove part and isolated from the second portion of the first lower electrode. A first dielectric layer is formed on the surface of the first lower electrode, and a second dielectric layer is formed on the surface of the second lower electrode. Further, an upper electrode layer formed in a single layer is formed on the surfaces of first and second dielectric layers.

This DRAM includes a so-called stacked type capacitor portion stacked on the semiconductor substrate and a so-called trench type capacitor portion formed by making the stacked type capacitor extend in the groove part formed in the region of the isolation insulating layer, thereby to increase the capacitance of the capacitor.

At the inner part of the groove, an upper electrode formed in a single layer is stacked on first and second lower electrodes isolated from each other, thus allowing the width of the groove to be reduced compared to the conventional trench type capacitor, such as a trench type capacitor shown in FIG. 17, for example.

In the second aspect of the invention, a method of manufacturing a DRAM includes the following steps. First of all, an isolation insulating layer is formed on a main surface of the semiconductor substrate. Next, impurities are ion-implanted into the main surface of the semiconductor substrate to form first and second impurity regions isolated from each other by an isolation insulating layer. Further, a groove part reaching the inner part of the semiconductor substrate is formed in the region of the isolation insulating layer. Then, a conductive layer is formed over the main surface of the semiconductor substrate and patterned to form a first lower electrode layer connected to the first impurity region and extending into the groove part, and a second lower electrode layer connected to the second impurity region and extending into the groove part. Further, a dielectric layer is formed on the surfaces of first and second lower electrodes. Then, a second conductive layer is formed on the surface of the dielectric layer and patterned to form an upper electrode layer formed in a single layer high above the first and second lower electrodes.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
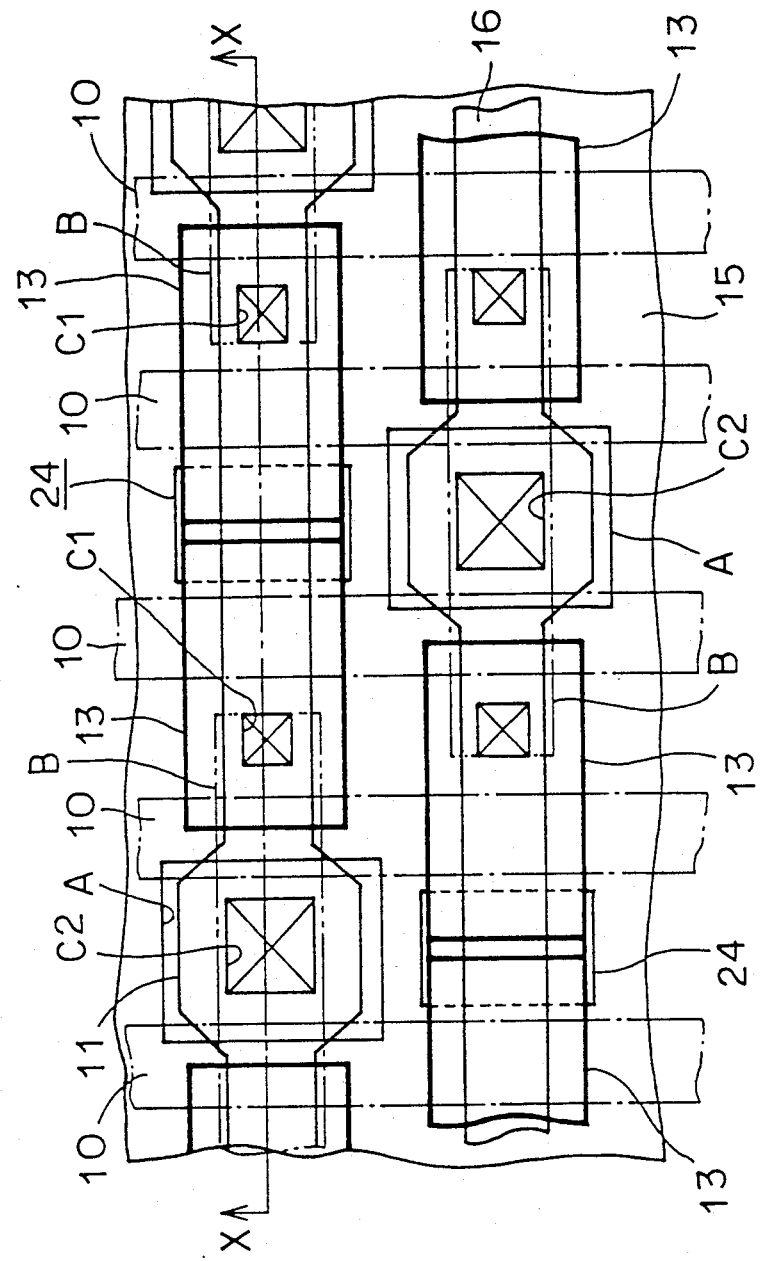
FIG. 1 is a plan structure view of a memory cell of a DRAM according to the embodiments of the present invention.
Figure 2:
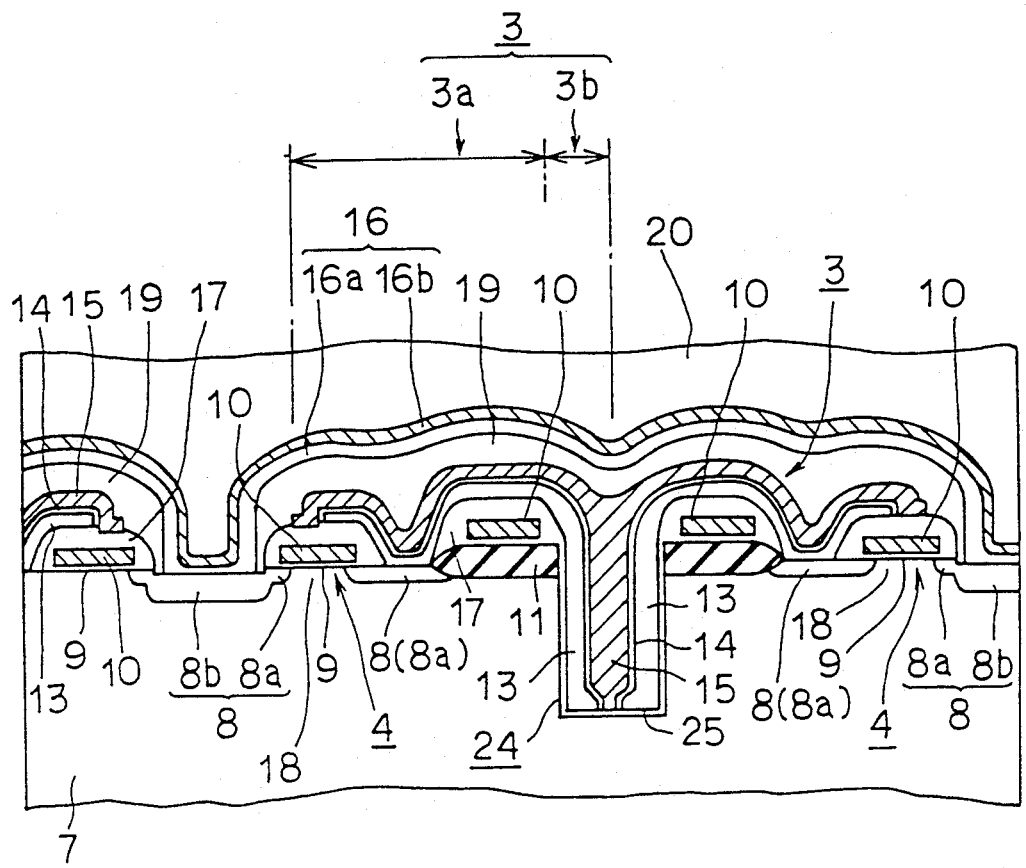
FIG. 2 is a sectional structure view of a memory cell taken on line X—X in FIG. 1.

In FIG. 2, memory cells corresponding to approximately 2 bits are shown. Referring to FIGS. 1 and 2, a plurality of word lines 10, 10 extending parallel to one another and a plurality of bit lines 16, 16 extending perpendicular thereto are formed on the surface of a p-type silicon substrate 7. A field isolation film 11 for isolating a plurality of memory cells adjacent to one another is formed on a main surface of p-type silicon substrate 7. In FIG. 1, a boundary line B between field isolation film 11 and an active area is shown by using two dotted line.

One memory cell includes one transfer gate transistor 4 and one capacitor 3. The transfer gate transistor 4 includes a pair of source/drain regions 8, 8 formed on the main surface of the p type silicon substrate 7 and a channel region 18 located therebetween, and a gate electrode 10 formed on the surface of channel region 18 with a gate oxide film 9 therebetween. The surface of the word line 10 extending on the surface of the field isolation film 11 or the gate electrode 10 is covered with an insulating layer 17.

The capacitor 3 includes a stacked type capacitor region 3a and a trench type capacitor region 3b. The capacitor 3 includes a lower electrode (storage node) 13 connected to one of source/drain regions 8 of the transfer gate transistor 4 through a contact part C1, a dielectric layer 14 formed on the surface of the lower electrode 13 and an upper electrode (cell plate) 15 covering the surface of the dielectric layer 14. The lower electrode 13, in the stacked type capacitor region 3a, extends from the upper part of the gate electrode 10 to the upper part of the word line 10 on the field isolation film 11, and extends into the groove 24 in the trench type capacitor region 3b, and is isolated from the lower electrode 13 of the adjacent capacitor on the bottom surface of the groove 24. The upper electrode 15 is formed as a single layer over the entire surface of memory cell array in which a plurality of memory cells are arranged, and an opening part A is formed only in the place where bit line contact part C2 is formed. In the groove 24, the upper electrode 15 completely fills the portion between lower electrodes 13, 13 of capacitors of memory cells adjacent to each other. Therefore, it has a relatively flat surface on the upper part of the groove 24. The groove 24 is in the region of the field isolation film 11 and formed between two word lines 10. An insulating film 25 which has a smaller thickness than the field isolation film 11 is formed on the inner surface and the bottom surface of the groove 24. This insulating film 25 secures the insulation between the p type silicon substrate 7 and the lower electrodes 13. For example, if the width of the field isolation film 11 shown in the center of FIG. 2 is in the range of about 4–5 μm, the groove 24 is formed to have the width of approximately 1.5–2 μm.

The bit line 16 is formed on the surface of an interlayer insulating layer 19 covering the surface of a memory cell. The interlayer insulating layer 19 is formed of TEOS (Tetraethyl Orthosilicate) film or the like, for example. The bit line 16 is connected to one of the source/drain regions 8 of the transfer gate transistor 4 through the contact hole in the interlayer insulating layer 19. The source/drain region 8 includes an impurity region 8b of high concentration formed at the connection portion with bit line 16 to reduce contact resistance. The bit line 16 is formed in a two-layer structure of a polycrystalline silicon layer 16a and a tungsten silicide layer 16b formed thereon. The surface of the bit line 16 is covered with a second interlayer insulating layer 20.

Figure 3:
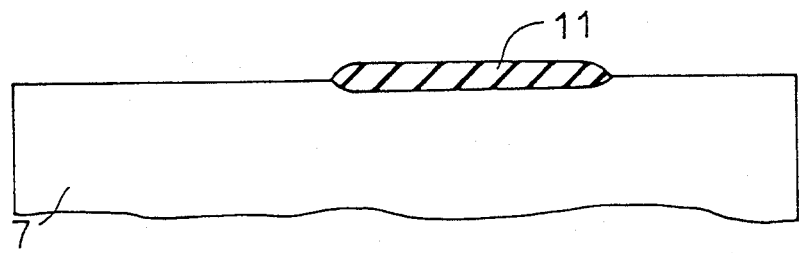
FIGS. 3 through 13 are sectional structure views showing in order the steps of manufacturing a memory cell of the DRAM shown in FIG. 2.

Next, a process of manufacturing a memory cell of a DRAM shown in FIG. 2 will be described. First of all, as shown in FIG. 3, the field isolation film 11 is formed on the main surface of the p type silicon substrate 7 by using LOCOS (Local Oxidation of Silicon) method.

Figure 4:
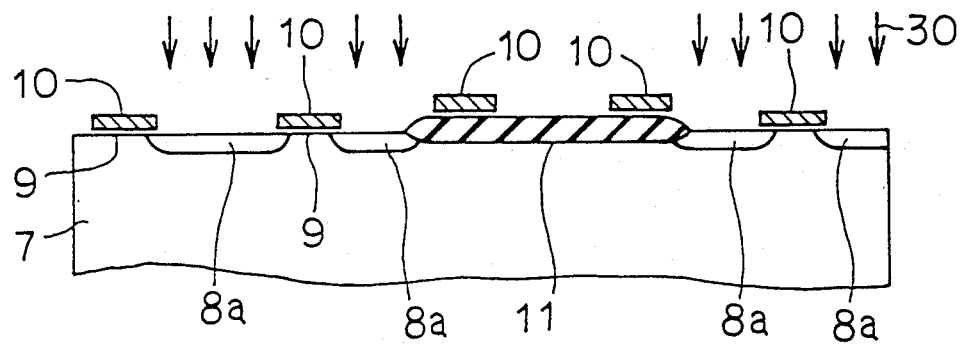

Then, as shown in FIG. 4, the gate oxide film 9 is formed on the main surface of the p type silicon substrate 7 by using, for example, a thermal oxidation method. Polycrystalline silicon layer is formed on the surface of the gate oxide film 9 by using, for example, CVD (Chemical Vapor Deposition) method and is patterned to a predetermined shape by using photolithography and etching. Thus, the gate electrode (word line) 10 is formed. Then, n type impurities 30 are ion-implanted into the surface of the p type silicon substrate 7, using the gate electrode 10 as a mask to form the source/drain regions 8a.

Figure 5:
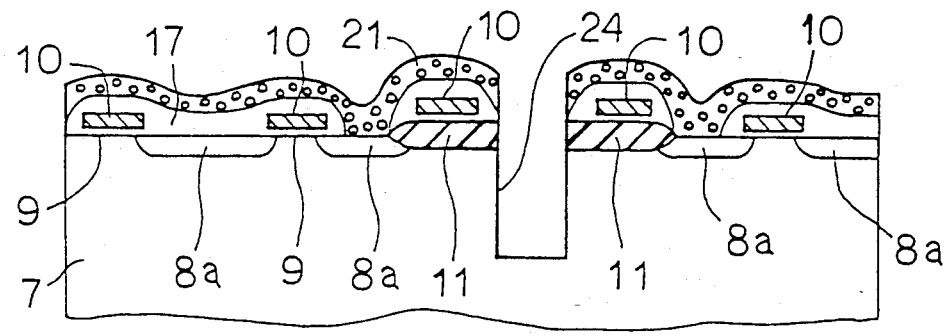

As shown in FIG. 5, the insulating layer 17 is formed around the gate electrodes 10. The insulating layer 17 is formed in a way to cover the surfaces of the source/drain regions 8a to be connected to a bit line. Further, a resist pattern 21 having an opening part is formed on the surface of the insulating layer 17. The opening part of the resist pattern 21 defines a plane form of the groove to be formed in the field isolation film 11. Thus, the field isolation film 11 and the p type silicon substrate 7 are etched, using this resist pattern 21 as a mask. The groove 24 formed by this etching is formed, for example, in a prismatic shape in the width of 1.5–2 μm, and the depth of 4–5 μm.

Figure 6:
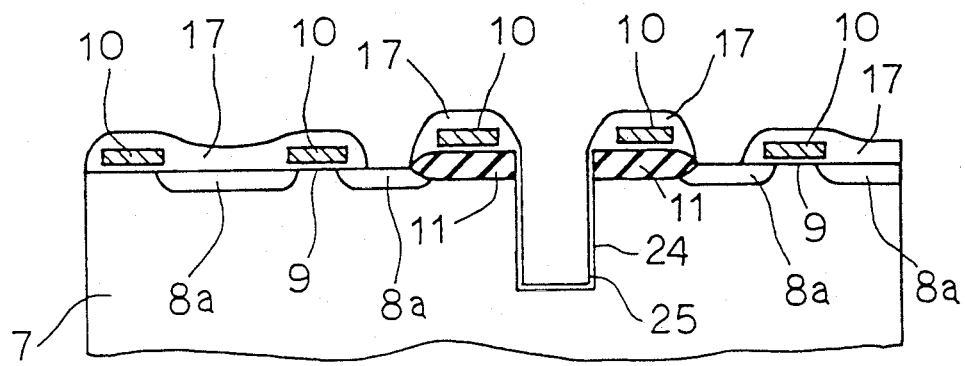

Also, as shown in FIG. 6, a thermal oxide film 25 is formed on the inner end bottom surfaces of the groove 24 in the thickness of 500–1000 Å by using the thermal oxidation method.

Figure 7:
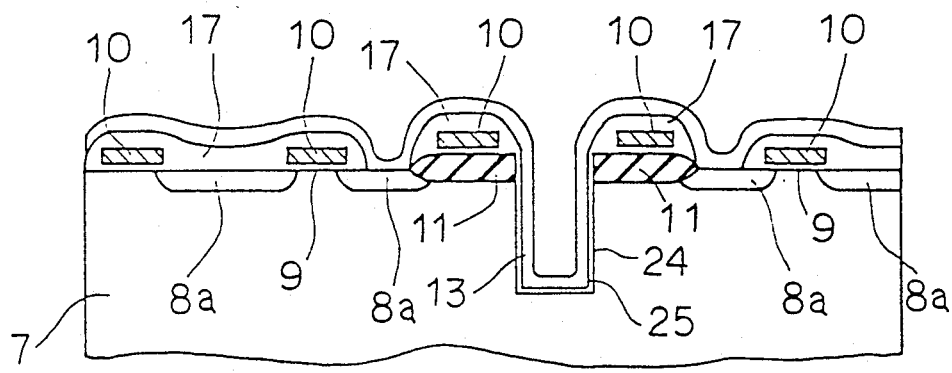

As shown in FIG. 7, after removing the resist pattern 21, a polycrystalline silicon layer 13 is deposited on the entire surface by, for example, CVD method, to have a thickness of about 1500–2000 Å.

Figure 8:
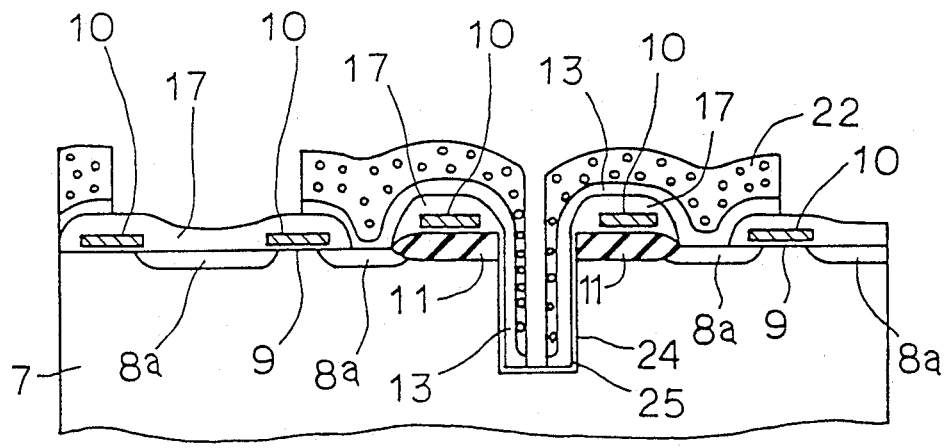

Then, as shown in FIG. 8, a resist pattern 22 is formed on the surface of the polycrystalline silicon layer 13 and, by using the resist pattern 22 as a mask, the polycrystalline silicon layer 13 is selectively etched. By this process, the lower electrode 13 of the capacitor is formed. On the bottom surface of the groove 24, the lower electrode 13 is isolated from the adjacent one.

Figure 9:
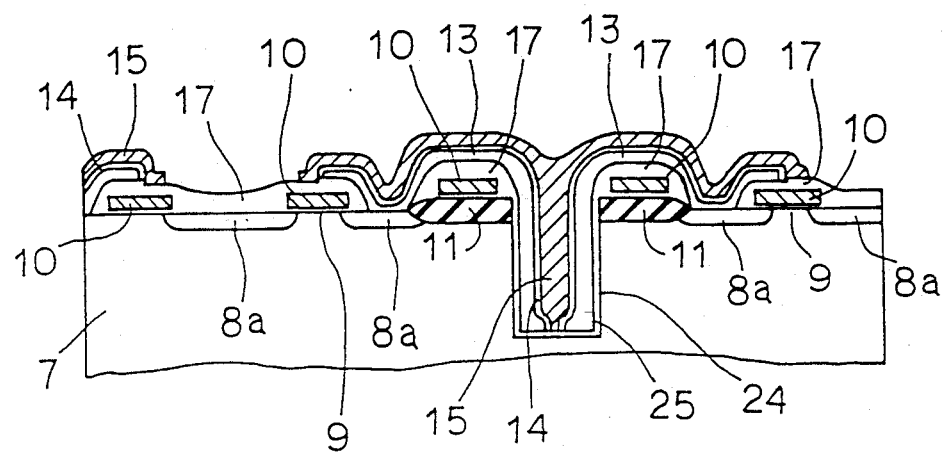

Next, as shown in FIG. 9, after removing the resist pattern 22, a nitride film is formed in the thickness of about 100–300 Å by using CVD method, again, to be patterned to a predetermined shape. Further, a dielectric layer 14 formed in a two-layer structure of a silicon nitride film and a silicon oxide film by effecting oxidation on the surface of the nitride film. Polycrystalline silicon layer is formed on the entire surface, using, for example, CVD method to be patterned to a predetermined shape. By this process, the upper electrode 15 of the capacitor is formed.

Figure 10:
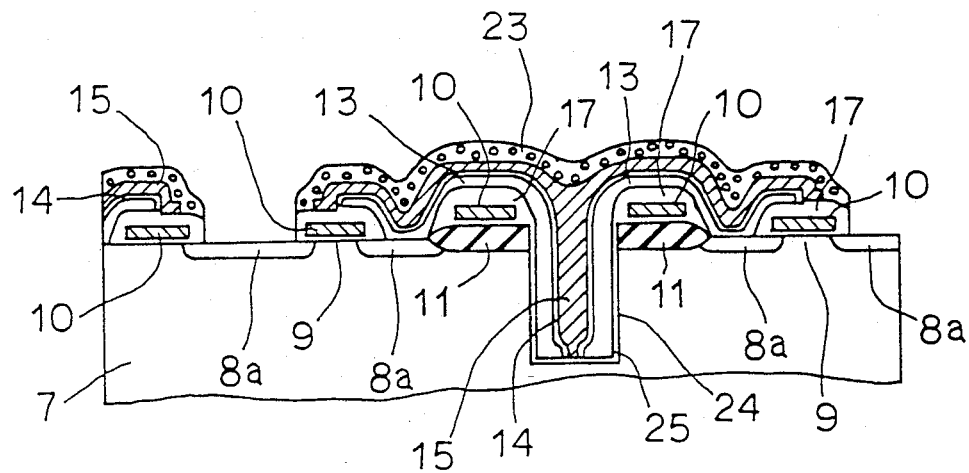

Further, as shown in FIG. 10, a resist pattern 23 is formed and, by using it as a mask, an opening part is formed in the insulating layer 17 located on the upper part of the source/drain region 8a.

Figure 11:
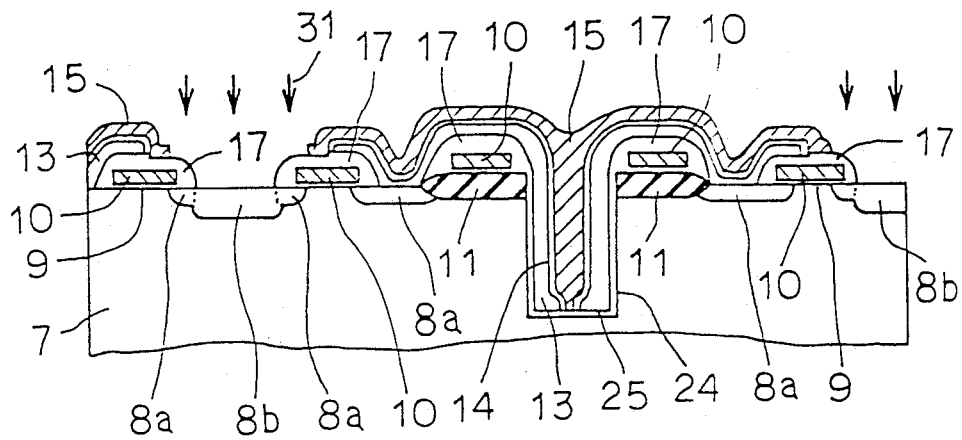

As shown in FIG. 11, n type impurity ions 31 are ion-implanted into the surface of the p type silicon substrate 7 through the opening part formed in the insulating layer 17 to form the n type impurity region 8b having high concentration.

Figure 12:
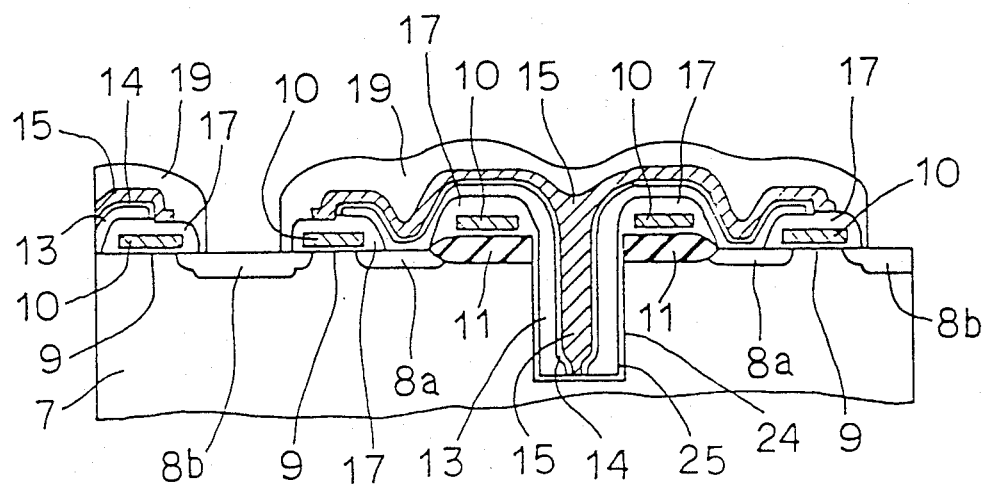

The entire surface is covered with a thick interlayer insulating layer 19 formed of TEOS film, for example, to be flattened as shown in FIG. 12. Opening part reaching the source/drain region 8b is formed, using photolithography and etching.

Figure 13:
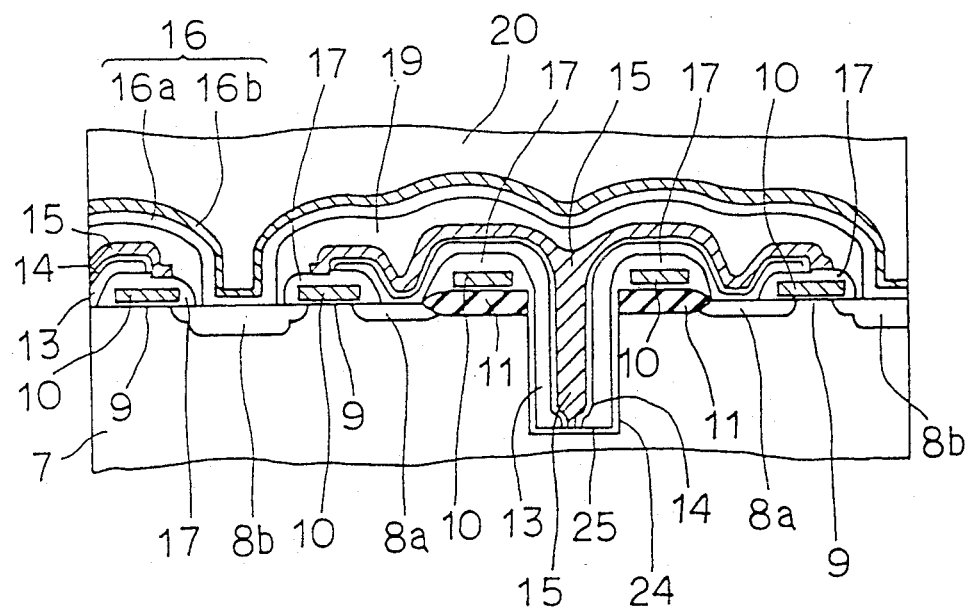
Figure 14:
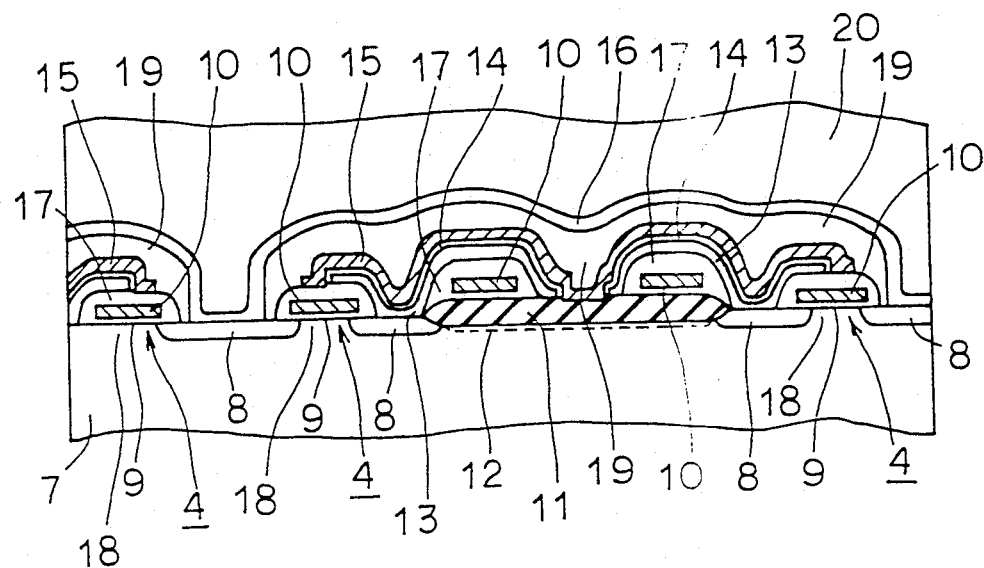
FIG. 14 is a sectional structure view of a memory cell of a conventional DRAM.
Figure 15:
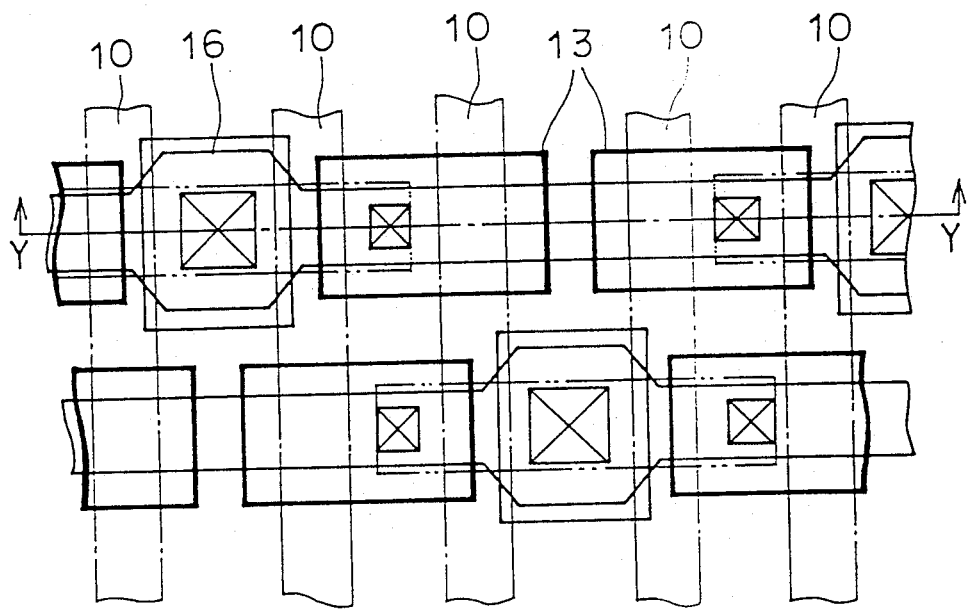
FIG. 15 is a plan structure view of a memory cell of a conventional DRAM.
Figure 16:
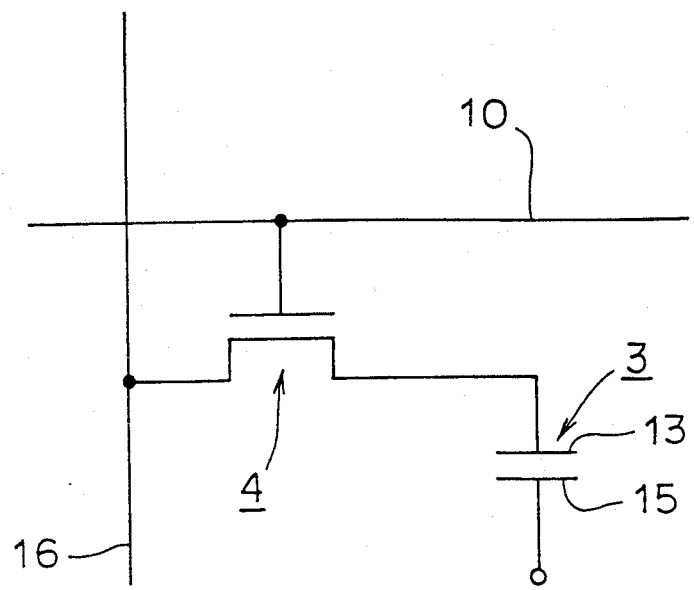
FIG. 16 is an equivalent circuit diagram of a memory cell of a general DRAM.
Figure 17:
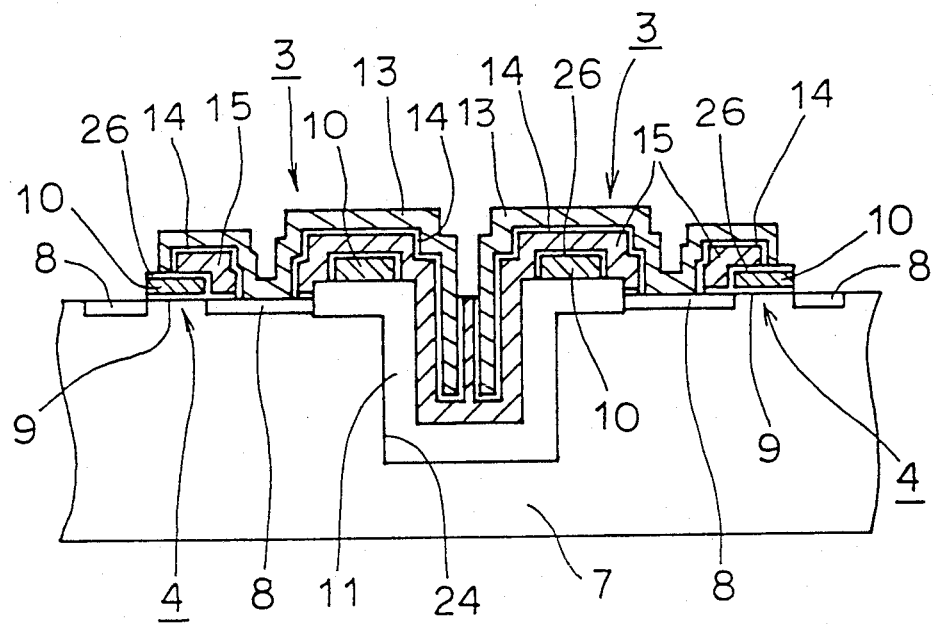
FIG. 17 is a sectional structural view of a memory cell of a DRAM according to the other conventional example.

Further, as shown in FIG. 13, a polycrystalline silicon layer 16a is formed on the surface of the interlayer insulating layer 19 and the n type impurity region 8b. Then, a tungsten silicide layer 16b is formed on the surface of a polycrstalline silicon layer 16a and patterned to a predetermined shape, thus forming a bit line 16. The entire surface is covered with thick, second interlayer insulating layer 20.

A memory cell of a DRAM is completed through the above described processes.

In the embodiment described above, though a case that the trench type capacitor region 3b of the capacitor 3 is formed in the prismatic groove 24 has been shown, the shape of the groove 24 is not limited to this, but, cylindrical, elliptic cylindrical or V-groove shapes are also available.

As described above, a DRAM according to the present invention can increase the capacitance of the capacitor without increasing the memory cell regions by forming a groove part in the field isolation film isolating memory cells adjacent to each another, and extending a part of the stacked type capacitor into this groove part to form so-called the trench type capacitor region.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device, comprising:
   a semiconductor substrate having a main surface;

an isolation insulating layer formed on the main surface of said semiconductor substrate, said isolation insulating layer having an upper surface and a lower surface, said lower surface of said isolation insulating layer being in contact with said main surface of said semiconductor substrate;

first and second impurity regions formed on the main surface and extending into said semiconductor substrate and isolated from each other by said isolation insulating layer;

a groove part extending into said isolation insulating layer and said semiconductor substrate and having inner lateral surfaces and a bottom surface;

an insulating layer having a smaller thickness than said isolation insulating layer, formed on said inner lateral surfaces and said bottom surfaces of said groove part and extending over said top surface of said isolation insulating layer, said insulating layer having a top surface and a bottom surface, said bottom surface of said insulating layer being in contact with said inner lateral surfaces and said bottom surface of said groove part, a first lower electrode having a first portion connected to said first impurity region and extending on the surface of said isolation insulating layer, and a second portion extending into said groove part in contact with said top surface of said insulating layer;

a second lower electrode having a third portion connected to said second impurity region and extending on the surface of said isolation insulating layer, and a fourth portion extending into said groove part in contact with said top surface of said insulating layer and isolated from said second portion of said first lower electrode;

a first dielectric layer formed on the surface of said first lower electrode;

a second dielectric layer formed on the surface of said second lower electrode and isolated from said first dielectric layer; and an upper electrode formed in a single layer and formed on the surfaces of said first and second dielectric layers.

2. The capacitor for the DRAM according to claim 1, wherein said first and second lower electrodes are isolated from each other on said bottom surface of said groove part.

3. The capacitor for the DRAM according to claim 1, wherein
each of said second portion of said first lower electrode and said fourth portion of said second lower electrode is formed on the surface of said insulating layer.

4. The capacitor for the DRAM according to claim 1, wherein first and second conductive layers extending parallel to each other are further formed on the surface of said isolation insulating layer, and said groove part is formed between said first and second conductive layers.

* * * * *